US007880298B2

(12) United States Patent
Drake et al.

(10) Patent No.: US 7,880,298 B2
(45) Date of Patent: Feb. 1, 2011

(54) SEMICONDUCTOR DEVICE THERMAL CONNECTION

(75) Inventors: Peter J. Drake, Benson, AZ (US); Chad E. Boyack, Tucson, AZ (US); Kevin Andrew Paulson, Salt Lake City, UT (US); James E. Faoro, Tucson, AZ (US); Cynthia Robin Nelson Konen, Anoka, MN (US); Steven N. Peterson, Tucson, AZ (US); George R. Cunnington, Oro Valley, AZ (US); James R. Myers, Tucson, AZ (US); Isis Roche-Rios, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 470 days.

(21) Appl. No.: 11/950,819

(22) Filed: Dec. 5, 2007

(65) Prior Publication Data

US 2009/0146292 A1    Jun. 11, 2009

(51) Int. Cl.
*H01L 23/10* (2006.01)
*H01L 23/34* (2006.01)
(52) U.S. Cl. ..................... 257/706; 257/707
(58) Field of Classification Search ................ 257/706, 257/707
See application file for complete search history.

(56) References Cited

U.S. PATENT DOCUMENTS

| 6,119,573 | A | 9/2000 | Berens et al. |
|---|---|---|---|
| 6,529,379 | B1 | 3/2003 | Fuller, Jr. et al. |
| 7,023,089 | B1 | 4/2006 | Lu |
| 2003/0128521 | A1* | 7/2003 | Matayabas et al. ........ 361/705 |
| 2004/0264136 | A1 | 12/2004 | Houle |
| 2006/0032622 | A1 | 2/2006 | Yen et al. |
| 2006/0035085 | A1 | 2/2006 | Ozaki et al. |
| 2006/0131738 | A1 | 6/2006 | Furman et al. |
| 2006/0220226 | A1 | 10/2006 | Renavikar et al. |

(Continued)

FOREIGN PATENT DOCUMENTS

WO        02067315        8/2002

OTHER PUBLICATIONS

International Search Report and Written Opinion from corresponding International Application No. PCT/US08/78689.

(Continued)

*Primary Examiner*—Phat X Cao
(74) *Attorney, Agent, or Firm*—Renner, Otto, Boisselle & Sklar, LLP (57) ABSTRACT

A semiconductor device thermal connection used to remove heat from a semiconductor device, such as an integrated circuit, includes a metallic barrier layer on the semiconductor device, and a high thermal conductivity material on the metallic barrier layer that joins the semiconductor device to a thermal heat spreader. The metallic barrier layer may be one or more sputtered layers, and the high thermal conductivity material may be a metallic material, for instance including indium, that is soldered onto the sputtered material. The high thermal conductivity material may form a primary thermal connection in conducting heat away from the semiconductor device. A secondary thermal connection may be made between the heat spreader and a heat sink. The secondary thermal connection may include a compressible solid carbon fiber material. A diaphragm may be used to contain the carbon fiber material, to prevent carbon fibers from coming into contact with the semiconductor device.

20 Claims, 4 Drawing Sheets

U.S. PATENT DOCUMENTS

2006/0261469 A1 11/2006 Ni et al.
2007/0069368 A1 3/2007 Archer, III et al.
2007/0111383 A1* 5/2007 Houle et al. ............... 438/106
2007/0287005 A1* 12/2007 Jayaraman et al. .......... 428/325

OTHER PUBLICATIONS

"Ball grid array", Wikipedi, [retrieved on Jan. 25, 2007], <http://en.wikipedia.org/wiki/Ball_grid_array>.
"Compliant Thermal Interface Materials" Energy Science Laboratories, Inc., VEL-THERM, San Diego, California.

* cited by examiner

SEMICONDUCTOR DEVICE THERMAL CONNECTION

GOVERNMENT RIGHTS

This invention was made with Government support under Government Contract NLOS LS SDD, Contract No. W31P4Q-04-C-0059, and under Government Contract Ground Based Missile Defense Development, Contract No. HQ0006-01-C-00. The government may have certain rights in this invention.

BACKGROUND OF THE INVENTION

1. Field of the Invention

The invention relates to the field of thermal control for semiconductor devices.

2. Description of the Related Art

Advances in semiconductor technology have lead to faster and smaller chips. These advances have led to a need for advances for removing heat from semiconductor devices. Accordingly, it will be appreciated that improvements would be desirable in this field of endeavor.

SUMMARY OF THE INVENTION

According to an aspect of the invention, a semiconductor device thermal connection includes: a metallic barrier layer on semiconductor material of a semiconductor device; and a high thermal conductivity material on the metallic barrier layer that joins the semiconductor to a high conductivity thermal heat spreader lid attached to the semiconductor device.

According to another aspect of the invention, a semiconductor device thermal connection includes: a compressible carbon fiber solid carbon velvet material between a high thermal conductivity heat spreader lid and a heat sink; and a diaphragm enclosing the compressible carbon fiber solid material.

According to yet another aspect of the invention, a method of making a thermal connection to a semiconductor material includes the steps of: sputtering a metallic barrier material on a surface of the semiconductor material; and melting and re-solidifying a metallic high thermal conductivity material on the metallic barrier material. The metallic barrier material prevents migration of the metallic high thermal conductivity material into the semiconductor material and promotes adhesion of the high thermal conductivity material to the semiconductor material.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings, which are not necessarily to scale.

DETAILED DESCRIPTION

A semiconductor device thermal connection used to remove heat from a semiconductor device, such as an integrated circuit, includes a metallic barrier layer on the semiconductor device, and a high thermal conductivity material on the metallic barrier layer that joins the semiconductor to a high conductivity thermal heat spreader lid attached to the semiconductor device. The metallic barrier layer may be a sputtered layer, and the high thermal conductivity material may be a metallic material, for instance including indium, that is soldered onto the sputtered material. The soldered high thermal conductivity material may form an intermetallic with the material of the sputtered layer. The high thermal conductivity material may form a primary thermal connection in conducting heat away from the semiconductor device. The heat may be conducted into a high thermal conductivity heat spreader, such as a plate made of copper.

The barrier layer prevents migration of the high thermal conductivity material into the semiconductor device. This allows the high thermal conductivity material to include metals that would possibly interfere with proper performance of the semiconductor device, if these materials were to migrate into the semiconductor device. The high thermal conductivity material may be a material with a relatively low melting temperature, for instance a solder including indium. Use of a low melting temperature material reduces stresses on the semiconductor device, relative to materials with higher melting points.

A secondary thermal connection may be made between the heat spreader and a heat sink. The secondary thermal connection may include a solid (carbon velvet) carbon fiber material that is coupled to both of the heat spreader and a heat sink. A suitable adhesive, such as a phase change adhesive, may be used to mechanically couple the carbon fiber material to the heat spreader. A diaphragm or membrane may be used to contain the carbon fiber material, to prevent electrically-conductive carbon fibers from coming into contact with the semiconductor device. The carbon fiber thermal connection advantageously is compressible, allowing for the secondary thermal connection to vary to some degree in thickness. This aids in compensating for variations in thickness of the semiconductor device package.

Figure 1:
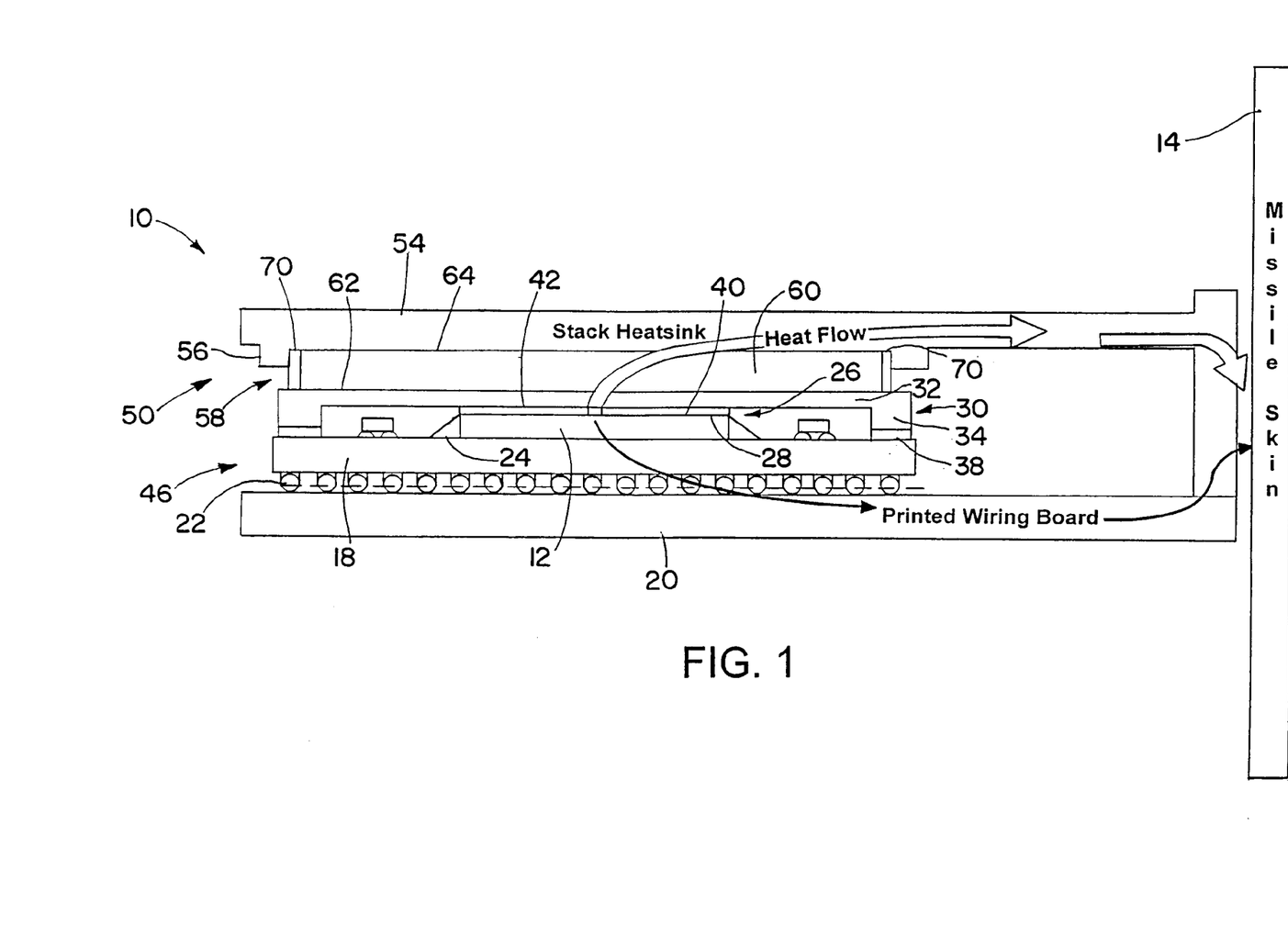
FIG. 1 is a cross section view of a semiconductor device installation in accordance with an embodiment of the invention.

FIG. 1 shows a semiconductor device installation 10, coupling a semiconductor device 12 such as an integrated circuit, microprocessor die, and/or other electronic components, to a structure 14. In the illustrated embodiment the structure 14 is a missile skin, although it will be appreciated that any of a wide variety of structures are encompassed by the structure 14.

The semiconductor device 12 is attached to a ceramic substrate 18, which in turn is electrically coupled to a printed wiring board 20 through a ball grid array 22. Epoxy corner parts 24 attach to both the semiconductor device 12 and the ceramic substrate 18. The corner parts 24 aid in mechanically coupling the semiconductor device or integrated circuit 12 to the ceramic substrate 14.

Figure 2:
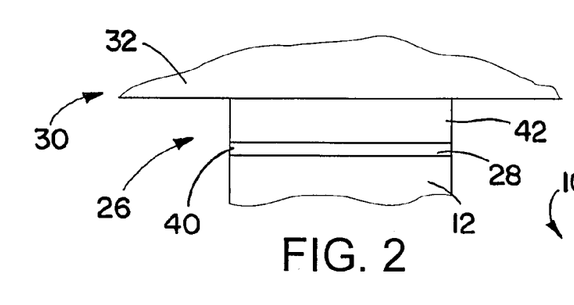
FIG. 2 is a cross section view of a portion of the installation of FIG. 1.

With reference now in addition to FIG. 2, a primary thermal interface 26 is attached to a top surface 28 of the semiconductor device 12. The primary thermal interface 26 provides a path for conducting heat created by the semiconductor device 12, from the device 12 to a heat spreader 30. The heat spreader 30 and the semiconductor device 12 are attached to opposite major surfaces of the primary thermal interface 26. The heat spreader 30 may be a copper structure that includes a planar member having a larger surface area than both the primary thermal interface 26 and the top surface 28 of the semiconductor device 12. Alternatively the heat spreader may be made of copper alloys, metal matrix composites, or other suitable high thermal conductivity material. The heat spreader 30 provides a high conductivity large surface area interface for conducting heat away from a semiconductor device 12. The heat spreader 30 may have 12 times the area of the semiconductor device or integrated circuit 12, although it will be appreciated that there are a large variety of possible areas for the heat spreader 30.

The heat spreader 30 includes a planar member 32 and a series of pillars 34. The pillars 34 allow attachment of the heat spreader 30 to the ceramic substrate 18 by use of heat spreader adhesive pads 38. The planar member 32 and the pillars 34 may all be made from a single piece of metal, such as copper. A suitable adhesive for the heat spreader adhesive pads 38 is Ablestik UF 8807, available from Ablestik Laboratories of Rancho Dominguez, Calif., USA. It will be appreciated that other suitable adhesives may be used to structurally secure the heat spreader 30 to the ceramic substrate 18. The heat spreader 30 may also have downward protrusions to aid in holding the semiconductor device 12 and the primary thermal interface 26 in place.

The primary thermal interface includes a barrier layer 40 in contact with the semiconductor device top surface 28, and a high thermal conductivity material 42. The high thermal conductivity material 42 is located between the barrier layer 40 and the heat spreader planar member 32. The barrier layer 40 prevents the high thermal conductivity material 42 from migrating into the semiconductor device 12. The barrier layer 40 thereby prevents unwanted contamination of the semiconductor device 12 by the high thermal conductivity material 42. In addition, the barrier layer 40 may serve to facilitate adherence of the high thermal conductivity material 42 onto the semiconductor device 12.

The high thermal conductivity material 42 may be a suitable metallic material. The high thermal conductivity material 42 may be applied as a solder, by melting it to adhere it to the barrier layer 40. The high thermal conductivity material may be or may include indium or an alloy of indium. Substantially pure indium (INDALLOY #4) is one suitable material for the high thermal conductivity material 42. Other suitable indium-containing INDALLOY specialty alloys may also be used. Also, it will be appreciated that other suitable metals and alloys may be utilized. Desirable characteristics for the high thermal conductivity material 42 include a large thermal conductivity and a low solidification temperature. A low solidification temperature combined with low modulus properties of the material in the solid phase places less stress on the semiconductor device 12 from cooling of the high thermal conductivity material 42 below its solidification temperature. It will be appreciated that the melting temperature and solidification temperature are the same for a pure material such as INDALLOY #4. However, there is a difference between the melting and solidification temperatures for alloys.

The high thermal conductivity material may include material that migrates from the sputtered layer used to form the barrier layer 40. For instance, the barrier layer 40 may initially be a sputtered layer containing sequential layers of titanium, nickel, and gold. Upon placement of liquid indium in contact with the sputtered nickel-gold layer the gold of the sputtered layer is dissolved into the indium, forming an indium-gold intermetallic. The sputtered barrier layer material may involve first sputtering of 500 angstroms of titanium, followed by 5000 angstroms of nickel, followed by 4000 angstroms of gold. Alternative metals may also be used. For example, chromium may be used in placed of nickel. As another example nickel may be followed by evaporated indium and then gold. The indium would be protected from oxide formation, thus increasing surface wettability and reducing voids in the reflowed indium interface.

Mechanical supports such as epoxy corner parts 24 and protrusions on the lower side of the heat spreader planar member 32 may aid in holding the semiconductor device 12 in a desired location. Indium solder connections may be relatively weak, and may benefit from additional mechanical support.

The semiconductor device 12 may have a silicon or silicon oxide surface that is not adhered to well by indium or other materials used in the high thermal conductivity material 42. A nickel or other suitable material in the barrier layer 40 may facilitate adherence of the high thermal conductivity material 42. Also, as noted above, the nickel or other material in the barrier layer 40 may serve to prevent unwanted migration of sputtered gold and high thermal conductivity material into the silicon or other semiconductor material of the semiconductor device 12.

The high thermal conductivity material 42 may be melted from a solid foil of material. For example, indium foil of about 0.05 mm (0.002 inches) thickness may be placed between the sputtered nickel-gold layer and a bottom surface of the heat spreader 30. It will be appreciated that other thickness and foil size ratios may be used. Melting and re-solidifying of the indium foil may be used to form the high thermal conductivity material 42 in contact with both the barrier layer 40 and the heat spreader 30. Gold from the sputtered nickel-gold layer may become soluble into the melted indium in a matter of seconds. The entry of the gold into the indium forms an $In_2Au$ intermetallic within the high thermal conductivity material 42.

It has been found that indium produces a low void high thermal conductivity material 42. When properly treated, an indium high thermal conductivity material 42 has been found to have less than 10% voids, and in some cases much less that 10% voids.

The semiconductor device 12, the metallic barrier layer 40, the ceramic substrate 18, the ball grid array 22, the heat spreader 30, and the primary thermal interface 26 together constitute a thermally-enhanced semiconductor device or integrated circuit 46. The thermally-enhanced semiconductor device 46 may be a production item that may be produced separately from the other elements of the semiconductor device installation 10. The thermally-enhanced semiconductor device 46 may be produced at a different time or in a different location, and may be stored without being assembled with the rest of the semiconductor device installation 10.

The primary thermal interface 26 with its high thermal conductivity material 42 may have a much lower thermal resistance than prior materials for making contact, such as thermal greases and adhesives. In addition the high thermal conductivity material 42 has the advantage of being stable over a wide range of environmental conditions.

The thermally-enhanced semiconductor device 46 is coupled to the printed wiring board 20 through the ball grid array 22. Such couplings are widely known in the art, and further details regarding the coupling across the ball grid array 22 are admitted herein. Although heat from the operation of the semiconductor device 12 is primarily conducted away through the primary thermal interface 26, it will be appreciated that there is also some conduction away in the opposite direction, through the ceramic substrate 18, the ball grid array 22, and the wiring board 20.

A secondary thermal interface 50 provides a heat path from the heat spreader 30 to a heat sink 54. The heat sink 54 is a metal part that is attached to the structure 14. The heat sink 54 has heat sink protrusions 56 that define a pocket 58 for receiving the secondary thermal interface 50.

The secondary thermal interface 50 includes a carbon fiber flocking material 60. The carbon fiber material 60 is a compressible material. It is a solid material, in that it does not contain any liquid or gel, other than a thin film, about 0.075 mm (0.003 inches) thick, of phase-change adhesive on both sides of the carbon fibers of the material 60. The individual carbon fibers of the material 60 may be substantially parallel to one another, and may be substantially perpendicular to the layers of phase-change adhesive on their ends. The thermoplastic phase-change adhesive of the carbon fiber material 60 melts to a gel-like consistency at temperatures above about 50 degrees C. The phase-change adhesive facilitates a low thermal resistance between the carbon fiber material 60 and what the material is in contact with. The phase-change adhesive wets the adjoining material, and replaces air at the tips of the carbon fibers. The material 60 is compressible in that the carbon fibers making up the carbon fiber material 60 may move relative to one another and may bend, or partially break to allow the material to compress. An example of such material is the carbon fiber material described in U.S. Pat. No. 6,119,573, which is herein incorporated by reference in its entirety. A suitable material for the compressible carbon fiber material 60 is material sold under the trademark VEL-THERM by Energy Science Laboratories, Inc., of San Diego, Calif., USA. The compressible carbon fiber material 60 provides a high level of thermal conductivity. It will be appreciated that other suitable secondary thermal materials may be used to provide a similar, perhaps less thermally conductive, interface.

The compressible carbon fiber material 60 provides both high thermal conductivity and a material that can compress in order to compensate for variations in height of the thermally-enhanced semiconductor device 46.

The compressible carbon fiber material 60 is adhesively adhered to the heat spreader 30 and to the heat sink 54 by respective adhesive layers 62 and 64 on opposite major surfaces of the compressible carbon fiber material 60. The adhesive layers 62 and 64 may be the phase-change adhesive that is discussed above as part of the carbon fiber material 60. The carbon fiber material 60 may be a polymer coated material, with individual carbon fibers coated with a suitable material such as parylene. The parylene coating of the entire fibers is implemented for two reasons: 1) to stiffen the fiber for increased compressive force and therefore lower thermal contact resistance at the fiber tips; and 2) to provide a dielectric coating on the fiber to render debris less electrically conductive. To adhesively attach the carbon fiber material 60 to the heat sink 54 and the heat spreader 30, heating is used to change the phase of the adhesive material in the layers 62 and 64. The adhesive material may be mounted while it is in contact with the heat sink 54 and/or the heat spreader 30. Rapid cooling causes the adhesive layers 62 and 64 to re-solidify, thus bonding the compressible carbon fiber material 60 to the heat sink 54 and/or the heat spreader 30. It will be appreciated that a wide variety of other suitable types of adhesive materials may be utilized.

A diaphragm or membrane 70 is a frame that is attached on its inner surface to the compressible carbon fiber material 60 around the perimeter of the carbon fiber material 60. The diaphragm or membrane 70 is also attached on its outer surface to the outside top ledge of the heat sink pocket 58. The diaphragm 70 serves to contain the carbon fibers of the compressible carbon fiber material 60. The carbon fibers of the material 60 are electrically conductive, and contact with the fibers could cause an electrical short circuit or other failures in the semiconductor device 12 and/or in the printed wiring board 20. Accordingly, it is desirable to prevent escape of individual carbon fibers from the compressible carbon fiber material 60. The diaphragm 70, like other parts of the secondary thermal interface 50, fits around the outside top ledge of the pocket 58.

Any of a variety of suitable materials may be used for the diaphragm 70. An example of the suitable material for the diaphragm 70 is KAPTON tape, a polyimide film with an acrylic adhesive.

Some venting may be necessary in order to allow air to escape as the carbon fiber material 60 is compressed. The diaphragm 70 may have small vent holes to allow air to escape, with the holes being small enough to prevent passage of carbon fibers. As an alternative, the heat sink 54 may have vent holes.

Figure 3:
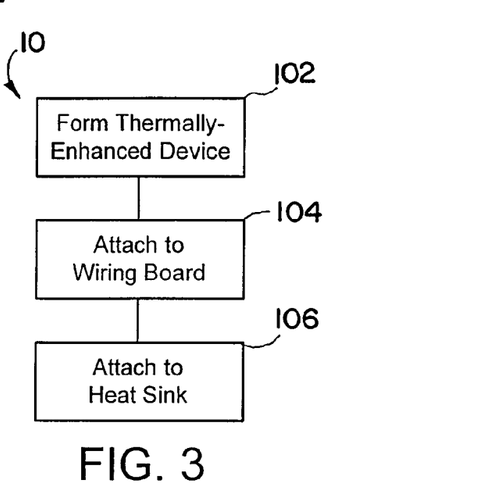
FIG. 3 is a high-level flow chart of steps in the formation of the semiconductor device installation of FIG. 1.

FIG. 3 shows some steps of a method 100 of forming the semiconductor device installation 10. The method 100 involves three high-leveled processes, which may be performed at different times and/or different locations. First, a thermally-enhanced integrated circuit or semiconductor device is formed in step 102. Second, the thermally-enhanced semiconductor device is attached to a printed wiring board in step 104. Finally, the thermally-enhanced semiconductor device or integrated circuit 46 is attached to the heat sink 54 in step 106.

Figure 4:
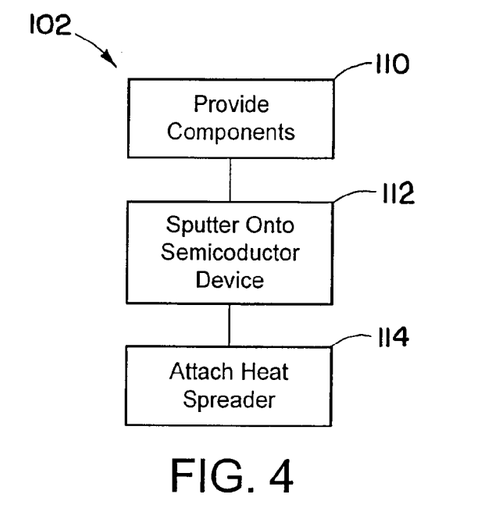
FIG. 4 is a flow chart showing further details of one of the steps of the method of FIG. 3, forming a thermally-enhanced integrated circuit.

FIG. 4 shows greater detail regarding the substeps of step 102, the forming of the thermally-enhanced semiconductor device 46. In substep 110, a package including the semiconductor device 12, the substrate 18, and the ball grid array 22 is provided. All of these devices may be commercially-available off-the-shelf devices. Operations for joining such devices are well known.

In substep 112 a top surface of the semiconductor device 12 is sputtered with layers of barrier material, such as titanium followed by nickel followed by gold sputtering or otherwise deposited as described above. The heat spreader 30 may also be sputtered or plated with a nickel-gold metallization).

In substep 114 the heat spreader 30 is attached to the semiconductor device 12 and the substrate 18. The foil material for the high thermal conductivity material layer 42 is placed atop the sputtered material 40 on the semiconductor device 12. Then the heat spreader 30 is pressed into place against the substrate 18, trapping the foil high thermal conductivity material between the sputtered barrier material 40 and the lower surface of the planar member 32 of the heat spreader 30. Suitable heating is applied to melt the foil, to thereby form the high thermal conductivity material 42 in contact with the heat spreader 30. An example of a suitable heating device is Palomar Technologies 3500-II Eutectic die attach workstation or any other reflow oven including vacuum or reducing gas reflow equipment. Subsequent cooling solidifies the high thermal conductivity material 42.

After the thermally-enhanced integrated circuit or other semiconductor device 46 is formed, it may be stored for use at a later time. It will be appreciated that the thermally-enhanced integrated circuit 46 may itself be a separate saleable product.

After formation of the thermally-enhanced integrated circuit 46, it may be coupled to the wiring board 20 in step 104 (FIG. 3), as described above. Coupling using ball grid arrays is well known, and it need not be further described here.

Figure 5:
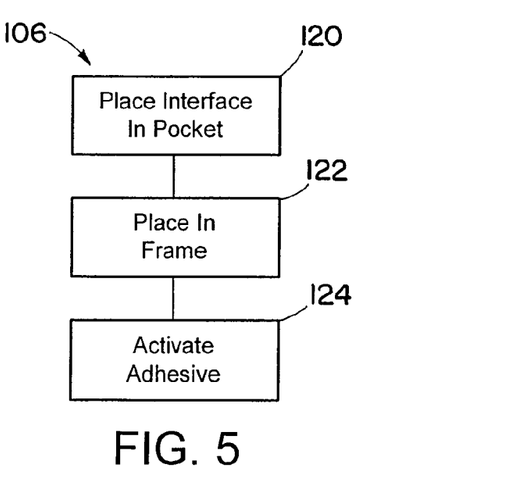
FIG. 5 is a flow chart showing further details of another of the steps of the method of FIG. 3, joining the integrated circuit and a wiring board with a heat sink.

FIG. 5 shows further detail regarding substeps of step 106, the coupling of the thermally-enhanced semiconductor device 46 to the heat sink 54. In substep 120 the secondary thermal interface 50 is placed in the pocket 58 between the heat spreader 30 and the heat sink 54. It will be appreciated that there are variations in the overall height of the thermally-enhanced semiconductor device 46. There are tolerances in the dimensions of the various components of the thermally-enhanced semiconductor device 46, and these tolerances may result in variations in the overall height of different samples of the thermally-enhanced semiconductor device 46. The compressibility of the carbon fiber material 60 allows combination with the different heights of the thermally-enhanced semiconductor device 46, while still maintaining good thermal conductivity between the heat spreader 30 and the heat sink 54. The thermally-enhanced semiconductor device 46 may have a height that varies, for example, by amounts of about 0.76 mm (0.03 inches) to 1.3 mm (0.05 inches).

In substep 122 the heat sink 54 and the wiring board 20 are placed in a suitable frame, and are held together at a desired overall thickness between outside ends of the printed wiring board 20 and the heat sink 54. This compresses the compressible carbon fiber material 60. Contact is maintained between the major surfaces of the carbon fiber material 60 and both the heat spreader 30 and the heat sink 54.

In substep 124 the adhesive layers 62 and 64 are activated to cause the carbon fiber material 60 to adhere to both the heat spreader 30 and the heat sink 54. As noted above, this activation may be effected by localized heating, causing a temporary melting of the phase change material of the adhesive layer 62 and 64.

Figure 6:
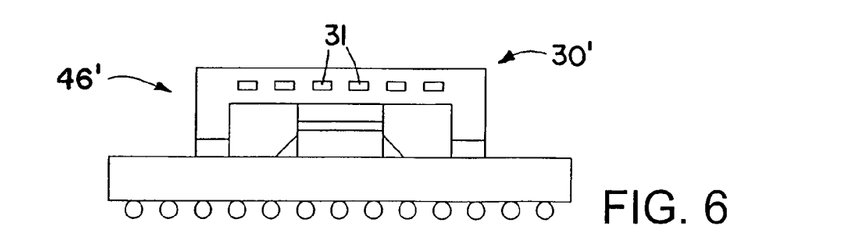
FIG. 6 is a cross section view of an alternate embodiment in accordance with the present invention, using a heat spreader with channels to allow flow of a cooling fluid.

FIG. 6 shows an alternate configuration thermally-enhanced semiconductor device 46', in which a heat spreader 30' has channels 31 there through. The channels 31 may be used to pump or otherwise move a suitable cooling fluid through. The cooling fluid, such as a suitable liquid, may be used to cool the heat spreader 30'. Other parts of the thermally-enhanced semiconductor device 46' may be substantially identical to the parts of the thermally-enhanced semiconductor device 46 (FIG. 1) described above. Such parts may be indicated by reference numbers in FIG. 6 without being discussed again here. The heat spreader 30' may allow sufficient heat removal without the need for the heat sink 54 (FIG. 1).

Figure 7:
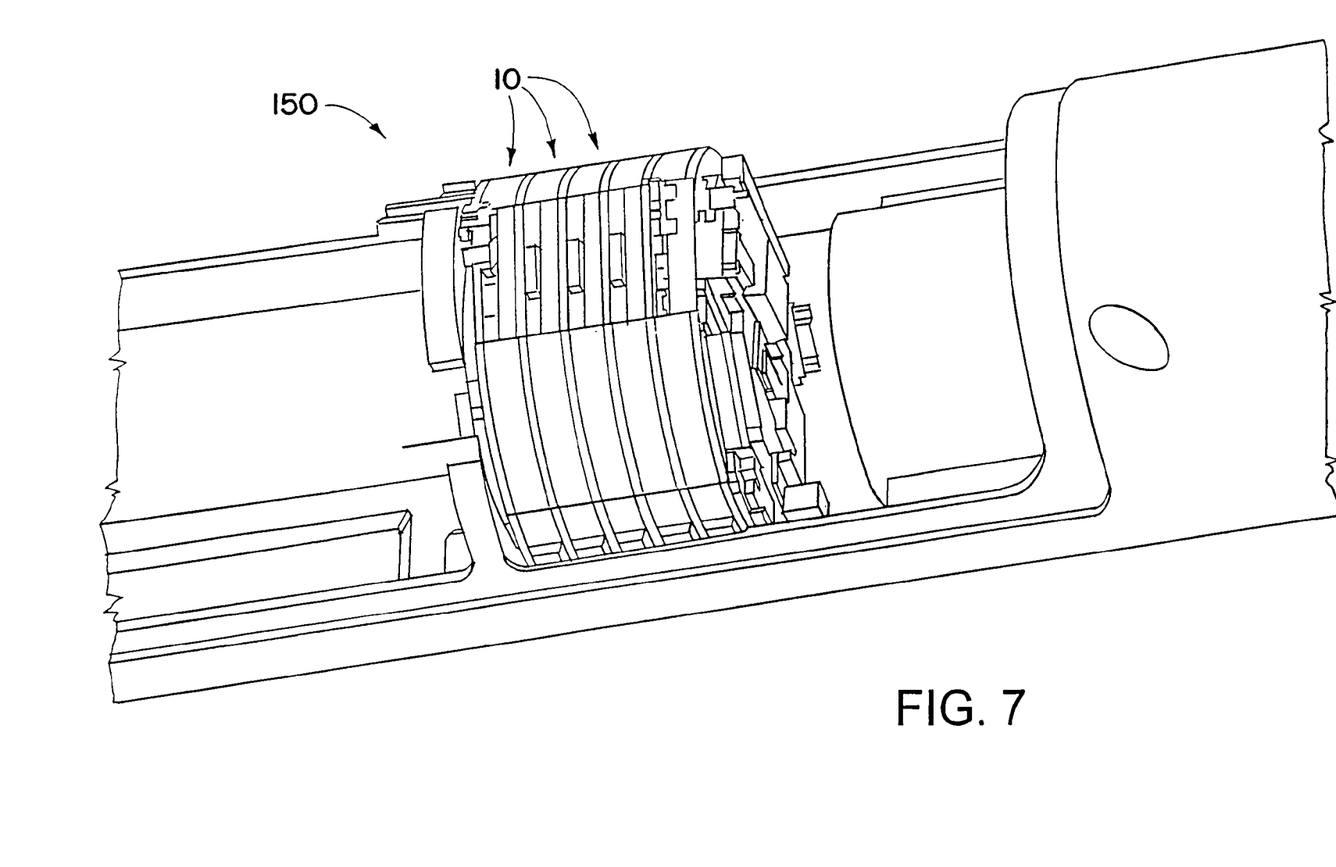
FIG. 7 is an oblique view showing configuration of multiple semiconductor device installations of FIG. 1 in a missile.

FIG. 7 shows a configuration of multiple semiconductor device installations 10 within a missile 150. It would be appreciated that each of the semiconductor installations 10 may involve multiple semiconductor devices. Heat removal systems as described herein may provide good heat transfer without use of external cooling devices such as cooling fans. This may allow for greater density of devices within a confined space, such as within a missile. In addition, weight and complexity may be saved and reliability increased by avoiding use of fans and power supplies for such fans.

Figure 8:
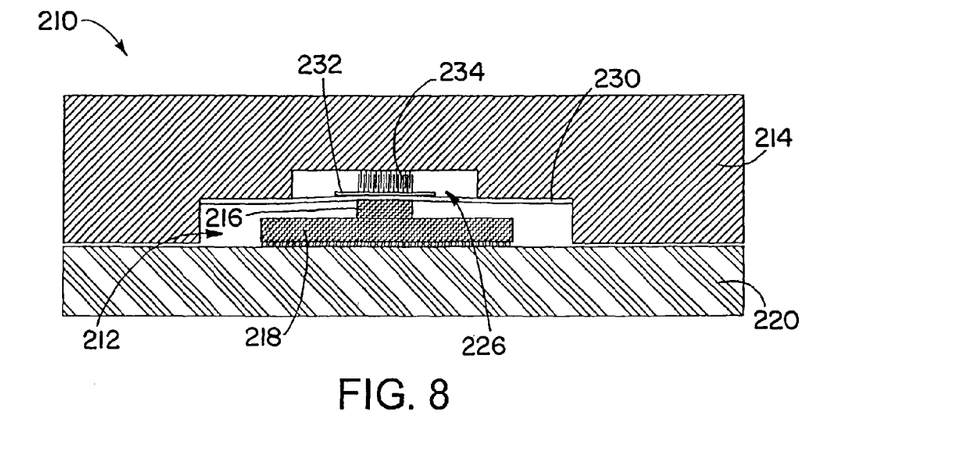
FIG. 8 is a cross section view of another alternate embodiment semiconductor device installation in accordance with the present invention.

FIG. 8 shows an alternate semiconductor device installation 210 for making a thermal contact between a circuit device 212 and a heat sink 214. The circuit device 212 includes an integrated circuit or semiconductor device 216, a substrate 218, and a ball grid array 222. These parts may be similar to the semiconductor device 12, the substrate 18, and the ball grid array 22 (FIG. 1) described above. The installation 210 also includes a printed wiring board or circuit card 220.

The heat sink 214 includes a pocket 226 into which the top of the integrated circuit 216 extends. A flexible diaphragm 230 encloses this pocket 226. Within the pocket 226 is a thermal plane 232 and a compressible carbon fiber material 234. The carbon fiber material 234 may be similar to the carbon fiber material 60 (FIG. 1) described above, and the material for the diaphragm 230 may be similar to the material for the diaphragm 70 (FIG. 1) described above. The thermal plane 232 may be a thin plane of highly thermally conductive metal, for instance copper. The diaphragm 230 serves to contain fibers of the carbon fiber material 234 within the pocket 226. This prevents the carbon fibers from escaping the pocket 226 and possibly coming into contact with the circuit device 212. The diaphragm 230 may be permeable or non-permeable, depending on whether airflow is needed there through.

As the heat sink 214 is brought into contact with the circuit card 220, the top of the semiconductor device 216 enters into the pocket 226, coming into contact with and pushing against the diaphragm 230. This in turn presses against the thermal plane 232, compressing the carbon fiber material 234. The carbon fiber material 234 therefore can accommodate variations in the overall height of the circuit device 212.

The diaphragm 230 may be adhesively coupled to the semiconductor device 216 and/or to the thermal plane 232. The thermal path between the circuit device 210 and the heat sink 214 has the advantage of compressibility. This may allow additional or looser tolerances in the manufacture of the circuit device 212 and/or the heat sink 214.

Figure 9:
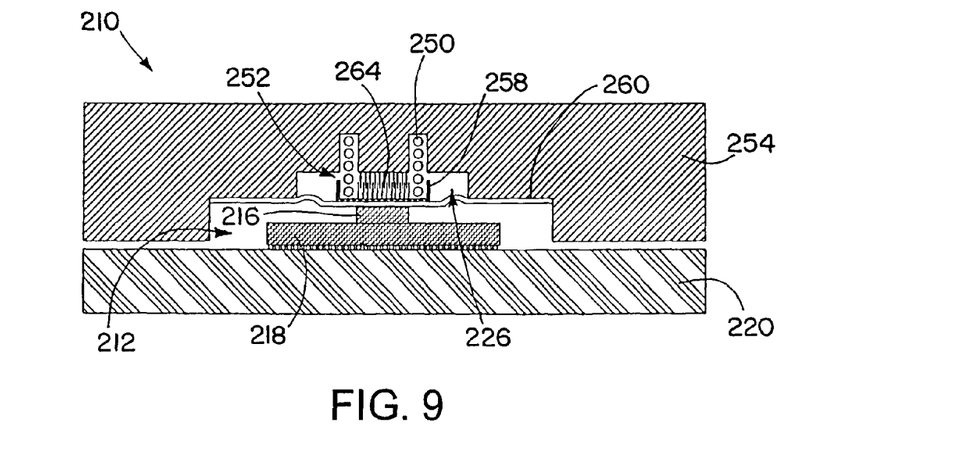
FIG. 9 is a cross section view of another alternate embodiment semiconductor device installation in accordance with the present invention.

FIG. 9 shows another alternative design, in which a spring 250 fits into a notch 252 in the heat sink 254. The lower end of the spring 250 engages a thermal plane 258 that presses against a diaphragm or membrane 260. The thermal plane 258 has upturned ends 262 to help contain the spring 250. The spring 250 surrounds a compressible carbon fiber material 264, which is bounded at the top by the heat sink 254, and at the bottom by the thermal plane 258.

The arrangement in FIG. 9 differs from that in FIG. 8 principally by the addition of the spring 250, which provides an additional force pressing down against the diaphragm 260, and from there onto the circuit device 212. Other aspects of the device alternative design may be similar to those of the installation 210 shown in FIG. 8.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A semiconductor device thermal connection comprising:
   a metallic barrier layer on semiconductor material of a semiconductor device;
   a high thermal conductivity material on the metallic barrier layer;
   a thermal spreader attached to the high thermal conductivity material;
   a heat sink;
   a secondary thermal interface between the thermal spreader and the heat sink, wherein the secondary thermal interface includes a compressible carbon fiber solid material; and
   a diaphragm that encloses the carbon fiber solid material;
   wherein the thermal spreader is made of one or more of copper, copper alloys, and metal matrix composites; and
   wherein the secondary thermal interface thermally couples the thermal spreader to the heat sink.

2. The semiconductor device thermal connection of claim 1, wherein the barrier layer is a sputtered metal layer.

3. The semiconductor device thermal connection of claim 1, wherein the barrier layer includes nickel.

4. The semiconductor device thermal connection of claim 1,
   wherein the high thermal conductivity material includes indium;
   wherein the indium forms an intermetallic with the barrier layer.

5. The semiconductor device thermal connection of claim 4,
   wherein the sputtered metal layer is placed prior to the placement of the high thermal conductivity material; and
   wherein the intermetallic is an indium-gold intermetallic.

6. The semiconductor device thermal connection of claim 1, further comprising a phase-change adhesive adhering the carbon fiber solid material to the heat spreader and the heat sink.

7. The semiconductor device thermal connection of claim 1, wherein the diaphragm includes a polyimide film.

8. The semiconductor device thermal connection of claim 1, wherein the diaphragm has vent holes therein to allow air to escape.

9. The semiconductor device thermal connection of claim 1, wherein at least part of the carbon fiber material and at least part of the diaphragm is within a pocket that is defined by heat sink protrusions of the heat sink.

10. A semiconductor device thermal connection comprising:
    a compressible carbon fiber solid material between a semiconductor device and a heat sink; and
    a flexible diaphragm enclosing the compressible carbon fiber solid material;
    wherein the carbon fiber material is in a cavity between the semiconductor device and the heat sink, which is at least partially defined by the diaphragm.

11. The semiconductor device thermal connection of claim 10, further comprising a thermal plane between the carbon fiber material and the diaphragm.

12. The semiconductor device thermal connection of claim 11, wherein the thermal plane is made of one or more of copper, copper alloys, and metal matrix composites.

13. The semiconductor device thermal connection of claim 11, further comprising a spring that engages the thermal plane, pressing the thermal plane against the diaphragm.

14. The semiconductor device thermal connection of claim 13, wherein the thermal plane had upturned ends that contain the spring.

15. The semiconductor device thermal connection of claim 10, further comprising a phase-change adhesive adhering the carbon fiber solid material to the heat sink.

16. The semiconductor device thermal connection of claim 10, wherein the diaphragm includes a polyimide film.

17. The semiconductor device thermal connection of claim 10, wherein the diaphragm has vent holes therein to allow air to escape from the cavity.

18. The semiconductor device thermal connection of claim 10, wherein at least part of the carbon fiber material is within a pocket in the heat sink that constitutes at least part of the cavity.

19. The semiconductor device thermal connection of claim 10, wherein the compressible carbon fiber solid material does not contain liquid or gel.

20. The semiconductor device thermal connection of claim 10, wherein individual carbon fibers of the compressible carbon fiber solid material are substantially parallel to one another.

* * * * *

UNITED STATES PATENT AND TRADEMARK OFFICE
CERTIFICATE OF CORRECTION

| | | |
|---|---|---|
| PATENT NO. | : 7,880,298 B2 | Page 1 of 1 |
| APPLICATION NO. | : 11/950819 | |
| DATED | : February 1, 2011 | |
| INVENTOR(S) | : Peter Drake et al. | |

It is certified that error appears in the above-identified patent and that said Letters Patent is hereby corrected as shown below:

Column 1, Line 10, replace "may have" with -- has --.

Signed and Sealed this
Fourteenth Day of June, 2011

David J. Kappos
*Director of the United States Patent and Trademark Office*